(12) United States Patent
Chang

(10) Patent No.: US 6,458,657 B1
(45) Date of Patent: Oct. 1, 2002

(54) METHOD OF FABRICATING GATE

(75) Inventor: Ching-Yu Chang, Yilan Hsien (TW)

(73) Assignee: Macronix International Co., Ltd., Hsinchu (TW)

( * ) Notice: Subject to any disclaimer, the term of this patent is extended or adjusted under 35 U.S.C. 154(b) by 41 days.

(21) Appl. No.: 09/726,460

(22) Filed: Nov. 30, 2000

(30) Foreign Application Priority Data

Sep. 25, 2000 (TW) .......................................... 89119720

(51) Int. Cl.⁷ .............................................. H01L 21/336
(52) U.S. Cl. ........................ 438/257; 438/258; 438/637; 438/700; 438/734; 438/66; 438/270
(58) Field of Search .............................. 438/637, 640, 438/699, 700, 701, 702, 703, 713, 717, 718, 734–740, 257, 258, 259, 260, 264, 270, 66

(56) References Cited

U.S. PATENT DOCUMENTS

| | | | |
|---|---|---|---|
| 5,067,002 A | * 11/1991 | Zdebel et al. | 357/59 |
| 5,353,246 A | * 10/1994 | Tsang et al. | 365/96 |
| 5,541,877 A | * 7/1996 | Shirai | 365/185.01 |
| 5,773,343 A | * 6/1998 | Lee et al. | 438/259 |
| 5,874,337 A | * 2/1999 | Geissler | 438/259 |
| 5,960,285 A | * 9/1999 | Hong | 438/264 |
| 5,998,261 A | * 12/1999 | Hofmann et al. | 438/257 |
| 6,025,228 A | * 2/2000 | Ibok et al. | 438/261 |
| 6,114,207 A | * 9/2000 | Okabe et al. | 438/270 |
| 6,180,997 B1 | * 1/2001 | Lin | 257/637 |
| 6,218,227 B1 | * 4/2001 | Park et al. | 438/216 |
| 6,232,663 B1 | * 5/2001 | Taniguchi et al. | 257/758 |
| 6,258,707 B1 | * 7/2001 | Uzoh | 438/618 |
| 6,391,719 B1 | * 5/2002 | Lin et al. | 438/259 |
| 6,396,078 B1 | * 5/2002 | Uochi et al. | 257/66 |

\* cited by examiner

Primary Examiner—John F. Niebling
Assistant Examiner—Renzo N. Rocchegiani
(74) Attorney, Agent, or Firm—J. C. Patents

(57) ABSTRACT

A method of fabricating a gate. A gate dielectric layer is formed, and a lower portion of a floating gate is formed encompassed by a first dielectric layer. Second dielectric layers with different etching rates are formed to cover the upper portion of the floating gate and the first dielectric layer. Using an etching mask, an opening is formed within the second dielectric layer to expose the floating gate and a portion of the second dielectric layers by performing an anisotropic etching process. Using the same etching mask, the second dielectric layers exposed within the opening is further etched by performing an isotropic etching process. Due to the different etching rates, a dielectric layer with an uneven and enlarged surface is formed. A conformal conductive layer is formed on the exposed lower portion of the floating gate and the exposed second dielectric layers as an upper portion of the floating gate. A conformal third dielectric layer is formed on the conformal conductive layer, followed by forming a control gate on the third dielectric layer.

10 Claims, 9 Drawing Sheets

METHOD OF FABRICATING GATE

CROSS-REFERENCE TO RELATED APPLICATION

This application claims the priority benefit of Taiwan application Ser. No. 89119720, filed Sep. 25, 2000.

BACKGROUND OF THE INVENTION

1. Field of the Invention

The invention relates in general to a fabrication method and a structure of a gate. More particularly, this invention relates to a method to increasing the effective surface of the dielectric layer between a floating gate and a control gate.

2. Description of the Related Art

Stacked-gate non-volatile memory devices such as erasable programmable read only memory (EPROM), electrically erasable programmable read only memory (EEPROM) and flash memory, have attracted great attention and research due to excellent data storage properties without the additional applying electric field.

The current-voltage (I-V) characteristics of the stacked-gate non-volatile memory devices can be derived by the I-V characteristics of the conventional metal-oxide semiconductor (MOS) device and the capacitive coupling effect. Normally, the higher the capacitive coupling effects a device has, the lower operatioin voltage is required.

FIG. 1 shows a structure of a conventional stacked-gate non-volatile flash memory after forming and patterning conductive layers 26 and 50. The conductive layers 26 and 50 construct a floating gate. A dielectric layer 24 is formed as the gate dielectric layer between the substrate and the floating gate. In FIG. 1B, a dielectric layer 52 is formed on the floating gate, and a control gate is formed on the dielectric layer 52. The control gate comprises a conductive layer 54. Both FIGS. 1A and 1B have a gate 58 and a non-gate region 60. The conductive layers 26 and 50 in the non-gate region 60 are removed while patterning the dielectric layer 52 and the conductive layer 54.

FIG. 2 shows a cross sectional view along the cutting line II—II as shown in FIGS. 1A and 1B. In FIG. 2, a gate is formed on a substrate comprising a semiconductor substrate 20, a source region 22 and a drain region 23. The gate comprises the gate dielectric layer 24, the conductive layers 26 and 50, the dielectric layer 52 and the conductive layer 54.

The conventional stacked-gate non-volatile flash memory comprises four junction capacitors. They are $C_{FG}$ between the floating gate (the conductive layers 26 and 50) and the control gate (the conductive layer 54), $C_B$ between the floating gate and substrate 20, $C_S$ between the floating gate and the source region 22, and $C_D$ between the floating gate and the drain region 23.

The capacitive coupling ratio can be represented by:

$$Capacitive\ coupling\ ratio = \frac{C_{FG}}{C_{FG} + C_B + C_S + C_D}$$

From the above equation, when the junction capacitor $C_{FG}$ increases, the capacitive coupling ratio increases.

The method for increasing the junction capacitance $C_{FG}$ includes increasing the effective surface of the dielectric layer between the floating gate and the control gate, reducing the thickness of the dielectric layer and increasing the dielectric constant (k) of the dielectric layer.

The dielectric layer between the floating gate and the control gate requires a sufficient thickness to prevent the electrons within the floating gate from tunneling to the control gate during operation to cause device failure.

The increase of the dielectric constant involves the replacement of fabrication equipment and a further advance fabrication technique, so that it is difficult to achieve.

Therefore, to increase the effective surface of the dielectric layer betweent eh floating gate and the control gate becomes a trend for increasing the capacitive coupling ratio.

In FIG. 2, in the conventional stacked-gate non-volatile memory, the dielectric layer 30 encircles the conductive layer 26. That is, the conductive layer 26 is formed in an opening 44 of the dielectric layer 30, while the surface level of the dielectric layer 26 is higher than the surface level of the conductive layer 26. Therefore, the upper portion of the opening 44 is not filled with the conductive layer 26. Instead, the upper portion of the opening 44 is filled with the conformal conductive layer 50. Being conformal to the dielectric layer 30 with the recess of the upper portion of the opening 44, the conductive layer 50 has a recess to result in an additional effective surface of the dielectric layer 52 formed subsequently. However, thus formed, the vertical thickness of the dielectric layer 52 is increased.

Referring to FIGS. 1A, 1B and 2, when the dielectric layer 52 and the conductive layer 54 are patterned, the dielectric layer 52, the conductive layer 54, the conductive layers 50 and 26 in the non-gate region are removed. As the conductive layer 50 has a recess, the vertical thickness of the dielectric layer 52 is far larger than the lateral thickness to cause great difficulty in etching, or even cause the dielectric layer residue. As a result, though the effective surface of the dielectric layer is increased, it is difficult to remove the dielectric layer 52 in the non-gate region 60. To remove the dielectric layer 52 completely, the depth of the recess has to be reduced. In this case, the effective surface is reduced.

The signal storage of the dynamic random access memory is performed by selectively charging or discharging the capacitors on the semiconductor surface. The reading or writing operation is executed by injecting or ejecting charges from the storage capacitor connected to a transfer field effective transistor.

The capacitor is thus a heart of a dynamic random access memory. When the surface of the memory cell is reduced, the capacitance is reduced to seriously affect the stack density of the memory. As a consequence, the read-out performance is degraded, the occurrence of soft errors is increased, and the power consumption during low voltage operation is increased. Increasing the surface area of the dielectric layer between the bottom and top electrode becomes one effective method to resolve the above problems. However, additional photomasks are required for achieving such goal, the fabrication cost is thus increased.

SUMMARY OF THE INVENTION

The invention provides a fabrication method and structure of a gate to increase the effective surface between the floating gate and the control gate of the gate. In addition, the vertical etching thickness of the dielectric layer is reduced.

In the method of fabricating a gate, a gate dielectric layer is formed, and a lower portion of a floating gate is formed encompassed by a first dielectric layer. Second dielectric layers with different etching rates are formed to cover the upper portion of the floating gate and the first dielectric layer. Using an etching mask, an opening is formed within the second dielectric layer to expose the floating gate and a portion of the second dielectric layers by performing an anisotropic etching process. Using the same etching mask, the second dielectric layers exposed within the opening is further etched by performing an isotropic etching process. Due to the different etching rates, a dielectric layer with an uneven and enlarged surface is formed. A conformal conductive layer is formed on the exposed lower portion of the floating gate and the exposed second dielectric layers as an upper portion of the floating gate. A conformal third dielectric layer is formed on the conformal conductive layer, followed by forming a control gate on the third dielectric layer.

In the above method, as the anisotropic and isotropic etching processes are performed using the same etching mask, the total number of photomasks is thus reduced. In addition, due to the different etching rates of the second dielectric layers, the opening with stair-like profile is formed. That is, the second dielectric layers exposed in the opening have a stair-like profile, therefore, the conformal conductive layer and the conformal third dielectric layer also have the stair-like profile. The surface area is thus greatly increase to enhance the performance of the device. In addition, the stair-like profile provides a larger surface area without introducing a deeper vertical etching depth. The problems in etching the dielectric layer are thus resolved.

By applying the above to the fabrication process of a capacitor, that is, to form a capacitor dielectric layer with the stair-like profile using the above method, the capacitance of the capacitor can be greatly increased. The first conductive layer itself, or the combination of the first conductive layer and the conformal conductive layer can be used as a bottom electrode. The third dielectric layer can be used as the capacitor dielectric layer, and the control gate can be used as the top electrode.

Both the foregoing general description and the following detailed description are exemplary and explanatory only and are not restrictive of the invention, as claimed.

DESCRIPTION OF THE PREFERRED EMBODIMENTS

First Embodiment

Figure 1A:
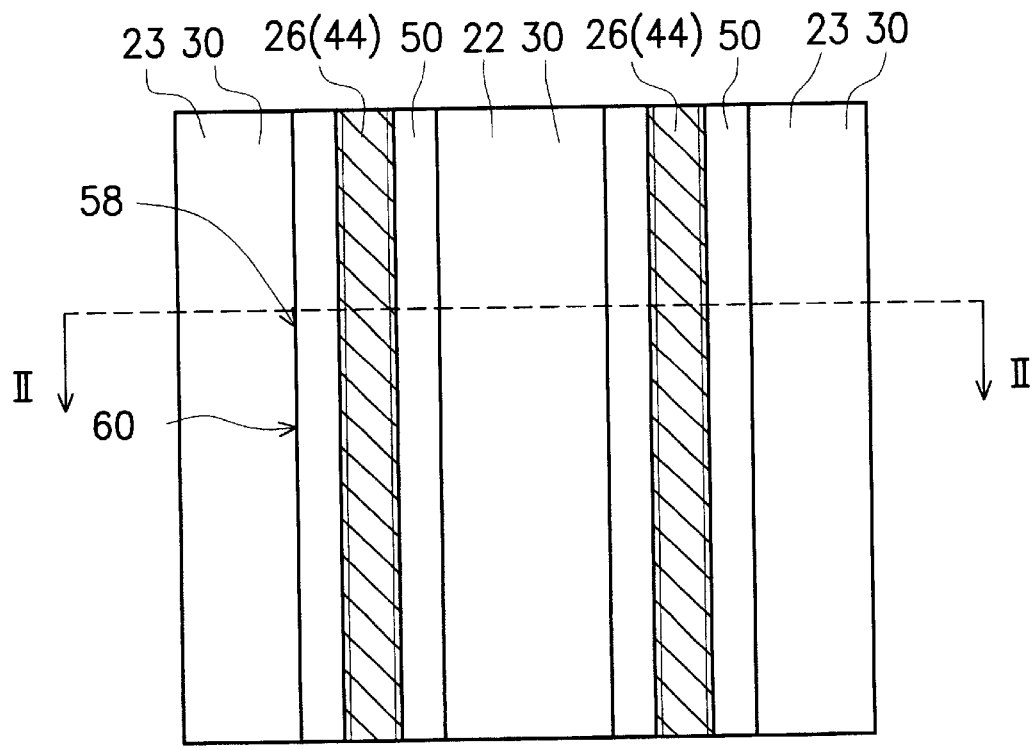
FIG. 1A shows a layout of a conventional stacked-gate non-volatile flash memory after forming the floating gate.
Figure 1B:
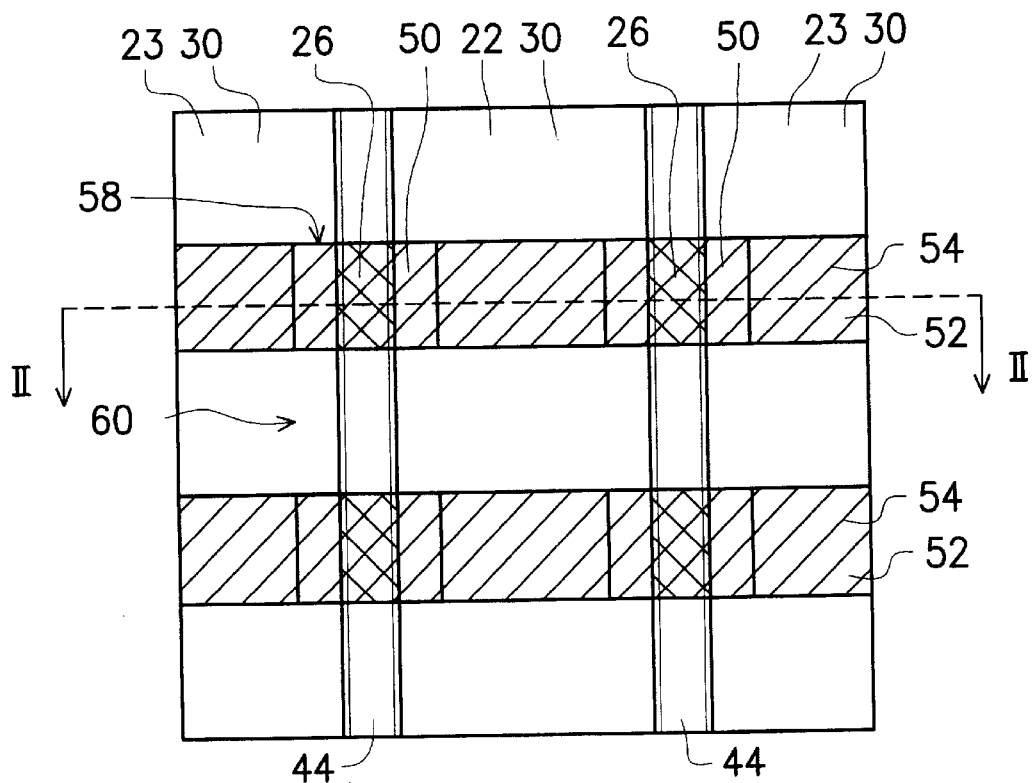
FIG. 1B shows the layout of the gate of the stacked-gate non-volatile flash memory as shown in FIG. 1A.
Figure 2:
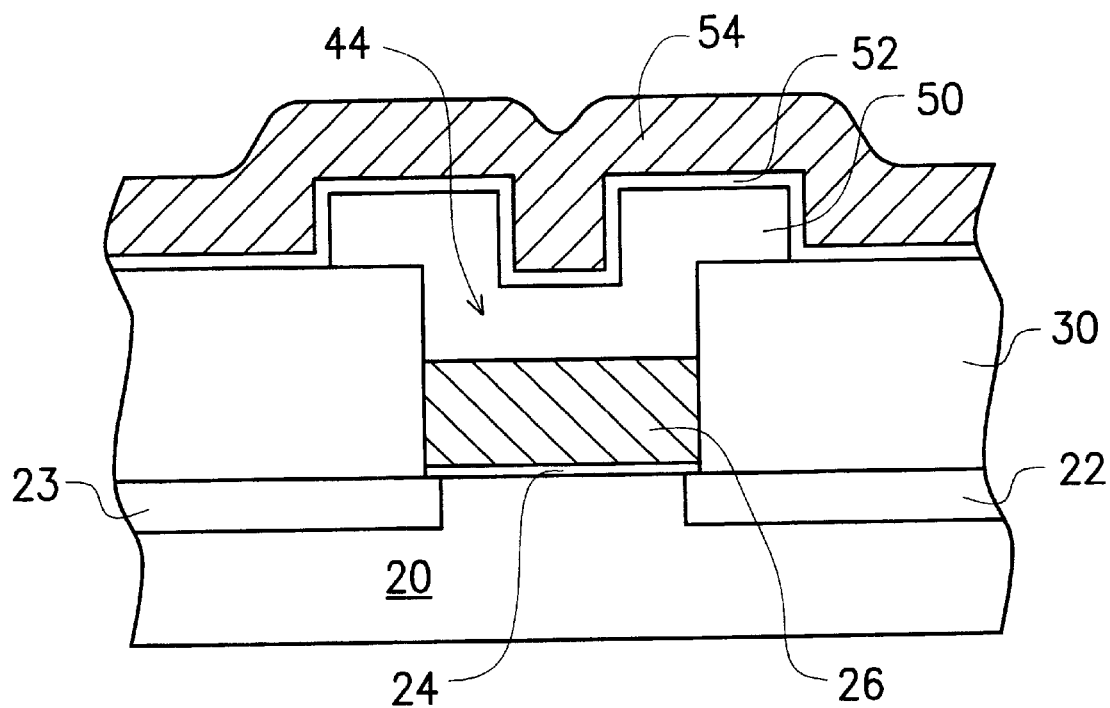
FIG. 2 shows a cross sectional view along the cutting line II—II as shown in FIG. 1.
Figure 3A:
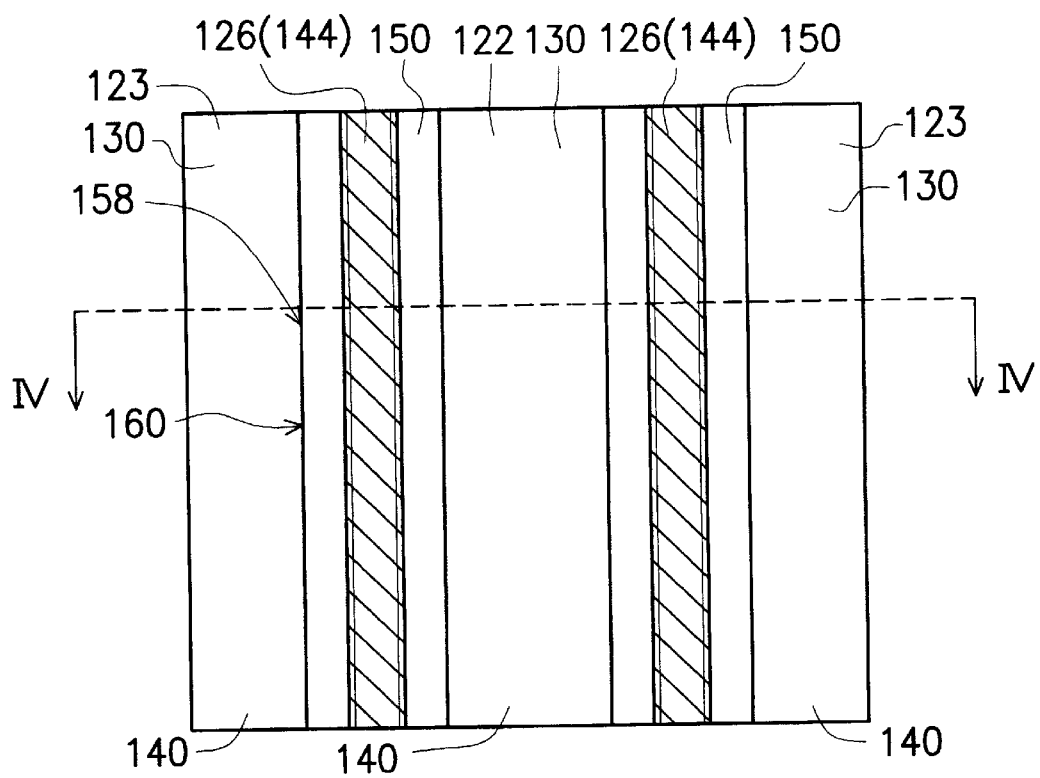
FIG. 3A shows a layout of a stacked-gate memory provided by the invention after the floating gate is patterned.
Figure 3B:
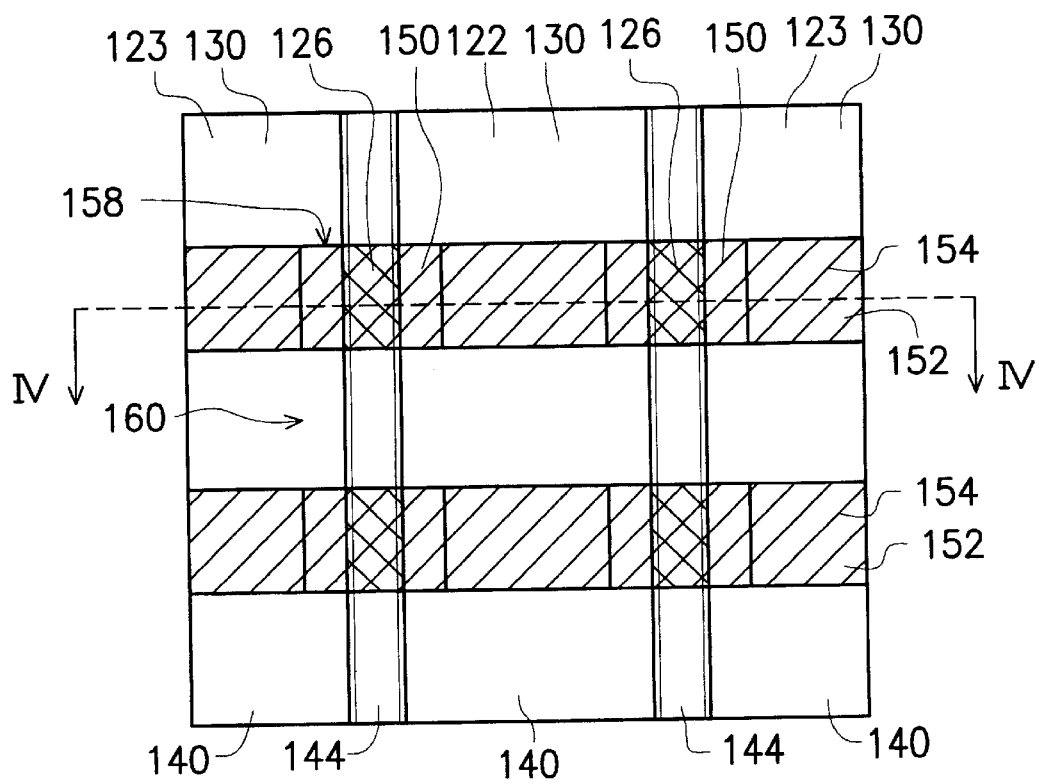
FIG. 3B shows a layout of the gate of the stacked-gate memory as shown in FIG. 3A.

In FIG. 3A, a stacked gate non-volatile flash memory is formed after conductive layers 126 and 150 are formed to construct a floating gate. A gate dielectric layer 124 is formed between the floating gate and a substrate. In FIG. 3B, a dielectric layer 152 is formed between the floating gate and a control gate. The conductive layer 154 is formed as the control gate. The structure in FIG. 3A and FIG. 3B comprises the gate region 158 and a non-gate region 160. The conductive layers 126 and 150 in the non-gate region 160 are removed while patterning the dielectric layer 152 and the conductive layer 154. FIG. 4A to FIG. 4F are cross sectional views along the cutting line IV—IV in FIG. 3A and FIG. 3B.

Figure 4A:
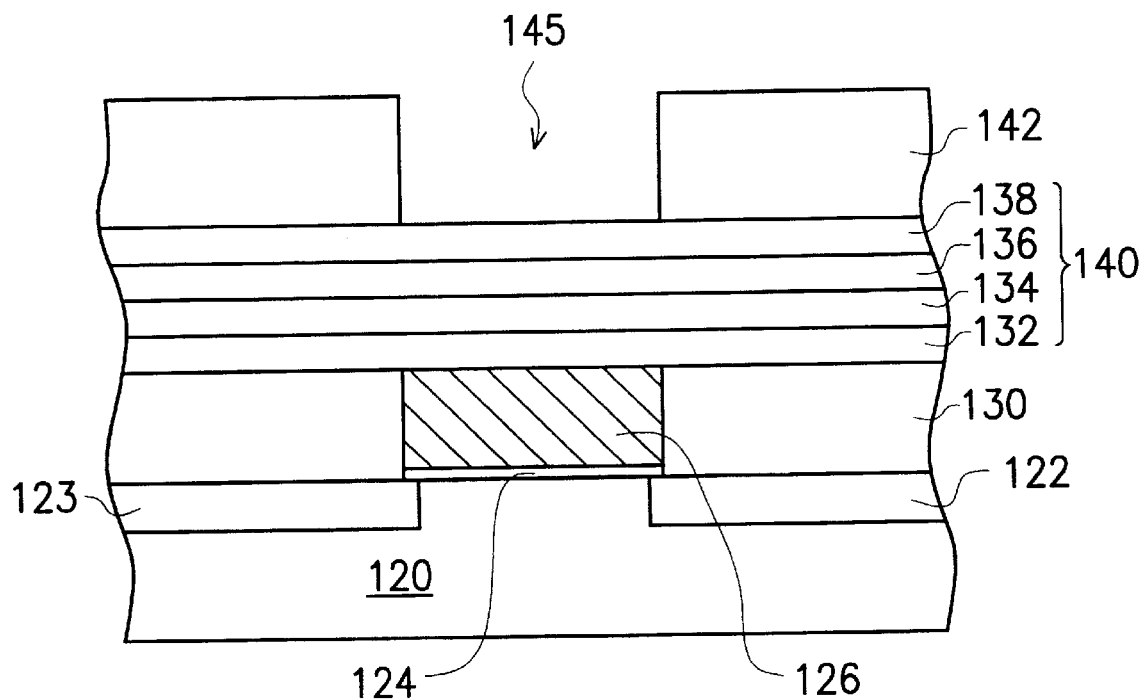
FIG. 4A to FIG. 4F are cross sectional views along the cutting line IV—IV in FIG. 3A and FIG. 3B; and FIG. 5A to FIG. 5F shows the application of the method provided by the invention to a dynamic random access memory.

In FIG. 4A, a semiconductor substrate 120 is provided. A source region 122, a drain region 123, a gate dielectric layer 124, a conductive layer 126 and a dielectric layer 130 encompassing the conductive layer 126 are formed the semiconductor substrate 120. Dielectric layer 140 comprising the layers 132, 134, 136 and 138 are formed over the substrate 120. Each of the dielectric layers 132, 134, 136 and 138 has an etching rate different from other dielectric layers. The material for forming the dielectric layers 132, 134, 136 and 138 comprises oxide, silicon nitride, doped oxide, doped silicon nitride, borosilicate glass (BSG), borophosphosilicate glass (BPSG), phosphosilicate glass (PSG), boro-oxide, phospho-oxide, borophospho-oxide, spin-on-glass or organic silicide containing silicon and oxide. The densities and dopant concentrations of each of the dielectric layers 132, 134, 136 and 138 can be adjusted to be different from each other to result in different etching rates, especially for the isotropic etching step. The thickness of these dielectric layers 132, 134, 136 and 138 can be different or identical. An etching mask 142 is formed on the topmost dielectric layer 138. The etching mask 142 layer comprises an opening 145 that exposes a portion of the dielectric layer 138. The layout of the opening 145 is shown as the dielectric layer opening 144 in FIG. 3A.

Figure 4B:
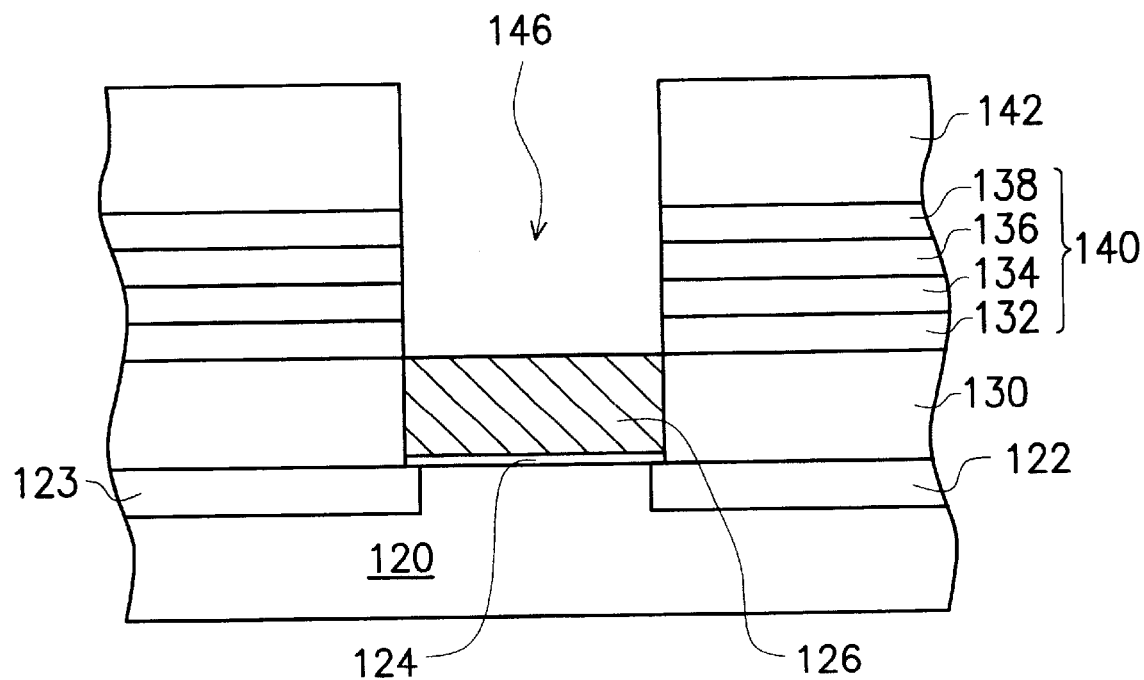

Referring to FIG. 4B, an anisotropic etching process is performed on the dielectric layer 140 to form an opening 146 exposing the underlying conductive layer 126. That is, a top surface of the conductive layer is exposed at a bottom of the opening 146.

Figure 4C:
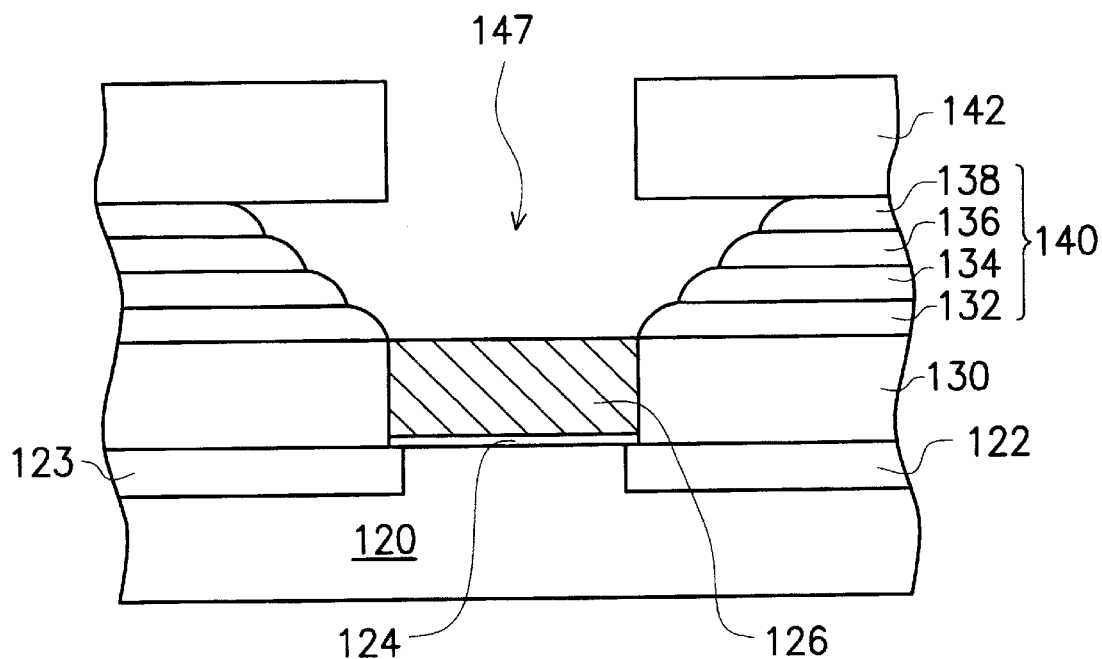
Figure 4D:
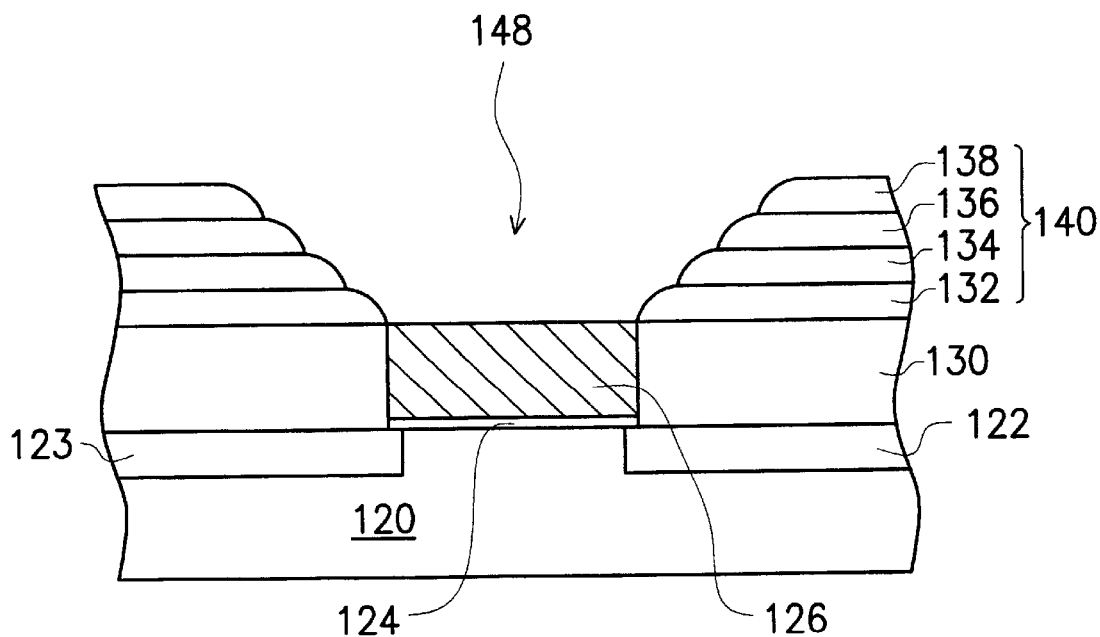

Referring to FIG. 4C, an isotropic etching process is performed on the dielectric layer 140 exposed within the opening 146. As the etching rates of the dielectric layers 132, 134, 136 and 138 are different, an opening 147 is resulted as shown in FIG. 4C and FIG. 4D. The mask 142 is removed. In this embodiment, the etching rates of the dielectric layer 140 are gradually decreases from the topmost dielectric layer 138 to the bottom most dielectric layer 132. Therefore, the resulting opening has a stair-like profile. The isotropic etching step includes chemical dry etch, chemical wet etch and chemical vapor etch. A mixture of hydrogen fluoride and ammonium fluoride, hydrogen fluoride, nitric acid and phosphoric acid can be used for performing the chemical wet etching. Since the anisotropic and isotropic etching steps are performed using the same mask 142, therefore, the total number of photomask is reduced.

In FIG. 4D, the mask layer 142 is removed, and the result opening is denoted as 148. The stair-like dielectric layaer 140 thus has an increased effective surface. The opening 148 comprises two slanting sidewalls. The slanting sidewalls can further be divided into small sections of the respective dielectric layers 132, 134, 136 and 138. Each section of the slanting sidewalls has a thickness thinner than the overall thickness of the dielectric layer 140.

Figure 4E:
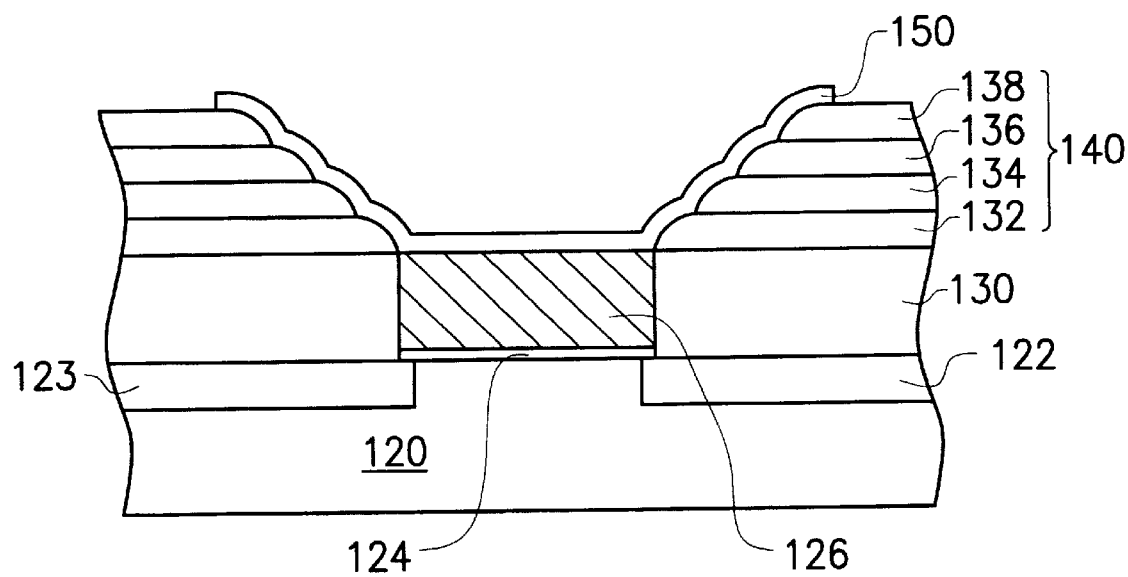

In FIG. 4E, a conductive layer 150 is formed on the slanting sidewalls and the conductive layer 126 exposed in the bottom of the opening 148. Preferably, the conductive layer 126 is formed to be conformal to the slanting sidewalls. The conductive layer 126 and the conductive layer 150 thus construct the floating gate.

A dielectric layer 152 between the floating gate and a control gate is then formed to cover at least the conductive layer 150 and the dielectric layer 138, and a conductive layer 154 is formed to cover at least this dielectric layer.

Figure 4F:
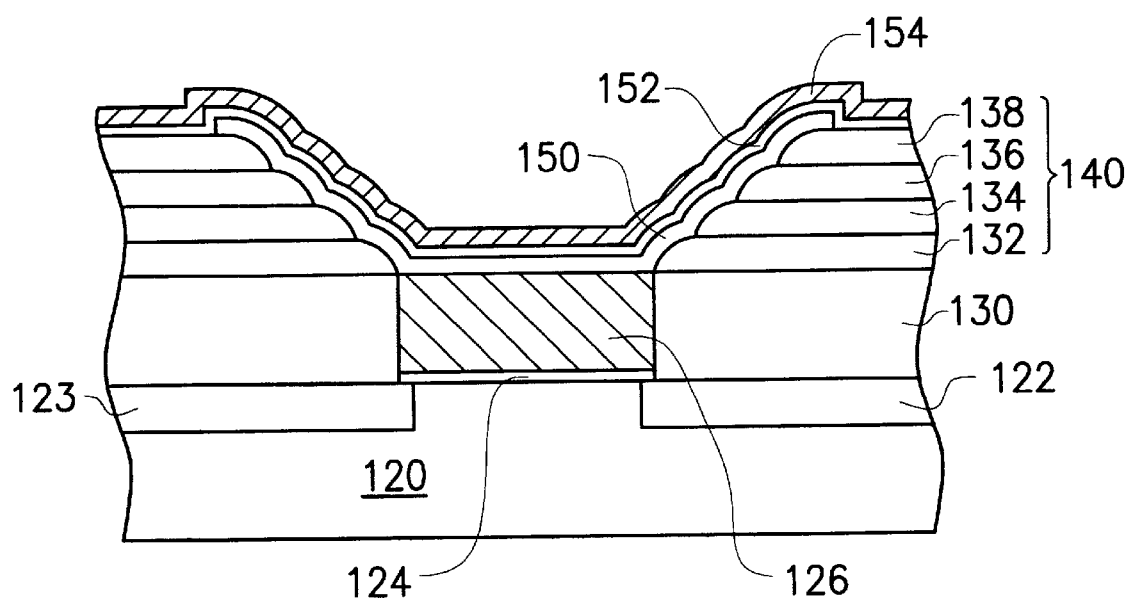

Preferably, the dielectric layer 152 is formed along the surface profile of the conductive layer 150, that is the surface profile of the opening 148. That is, the dielectric layer 152 is conformal to the etched dielectric layer 140. Referring to FIGS. 3A, 3B and 4F, the conductive layer 154 and the dielectric layer 152 are patterned. The patterned conductive layer 154 is the control gate. The material for forming the dielectric layer 152 includes silicon nitride, silicon oxide, oxide/nitride/oxide (ONO), a lead zirconium titanate, bismuth strontium titanate and tantalum oxide. The conductive layers 150 and 154 include polysilicon and tungsten silicide.

Referring to FIG. 3A, FIG. 3B and FIG. 4F, the conductive layer 154, the dielectric layer 152, the conductive layer 150, and the conductive layer 126 in the non-gate region 160 are removed while patterning the conductive layer 154 and the dielectric layer 152. As a result, the dielectric layer 152 between the control gate and the floating gate has stair-like profile with an enlarged effective surface. The stair-like profile does not result in difficulty in vertical etching. Therefore, the effective surface of the dielectric layer is enlarged without increasing the thickness thereof.

Second Embodiment

Figure 5A:
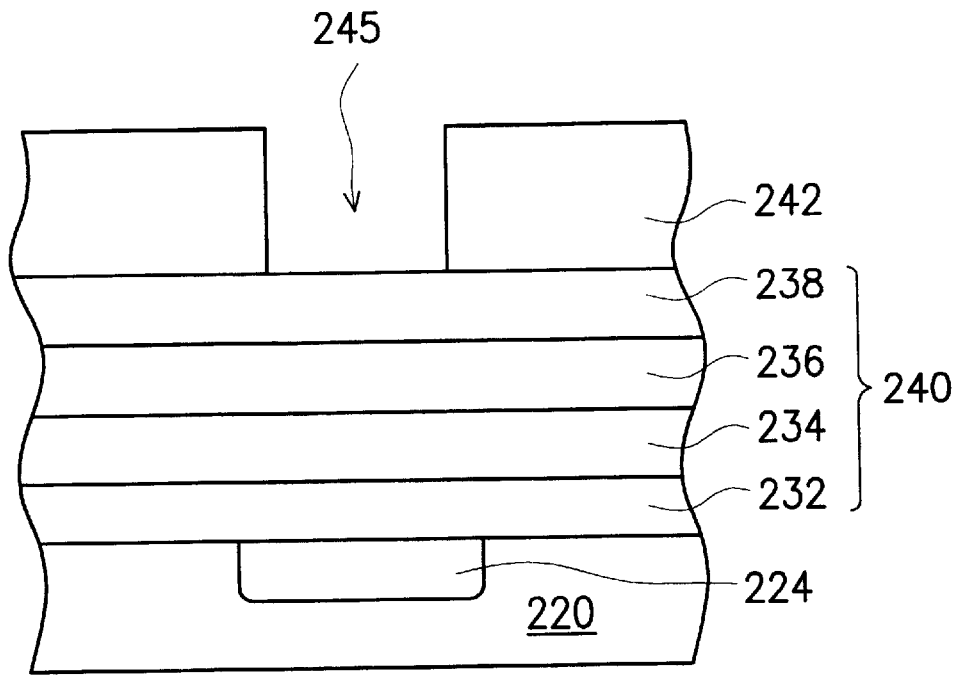

FIG. 5A to FIG. 5F illustrate a second embodiment of the invention that provides a method for fabricating a gate of a capacitor of a dynamic random access memory. In FIG. 5A, a dielectric layer 240 comprising a stack of dielectric layers 232, 234, 236, 238, is formed on a substrate 220 on which a device region 224, for example, a source/drain region, is formed. The material for forming the dielectric layers 132, 134, 136 and 138 comprises oxide, silicon nitride, doped oxide, doped silicon nitride, borosilicate glass (BSG), borophosphosilicate glass (BPSG), phosphosilicate glass (PSG), boro-oxide, phospho-oxide, borophospho-oxide, spin-on-glass or organic silicide containing silicon and oxide. The densities and dopant concentrations of each of the dielectric layers 232, 234, 236 and 238 are different from each other. The thickness of these dielectric layers 232, 234, 236 and 238 can be different or identical. An etching mask 242 is formed on the topmost dielectric layer 138. The etching mask 242 layer comprises an opening 245 that exposes a portion of the dielectric layer 238 aligned over the device region 224.

Figure 5B:
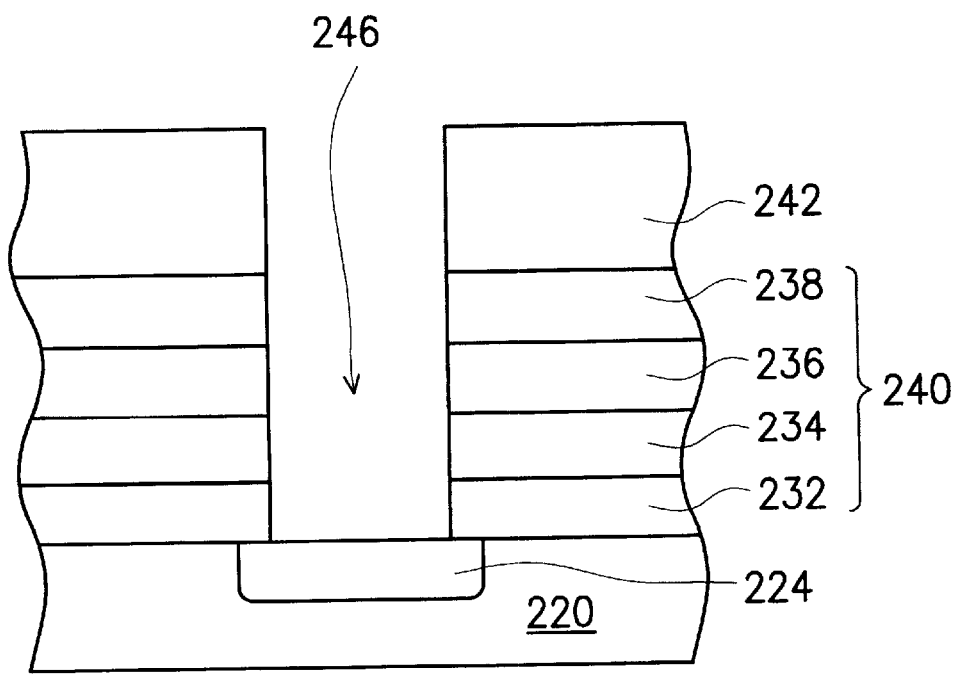

In FIG. 5B, an isotropic etching step is performed to remove the dielectric layer 240, so that an opening 246 is formed to expose the device region 224 of the substrate 224.

Figure 5C:
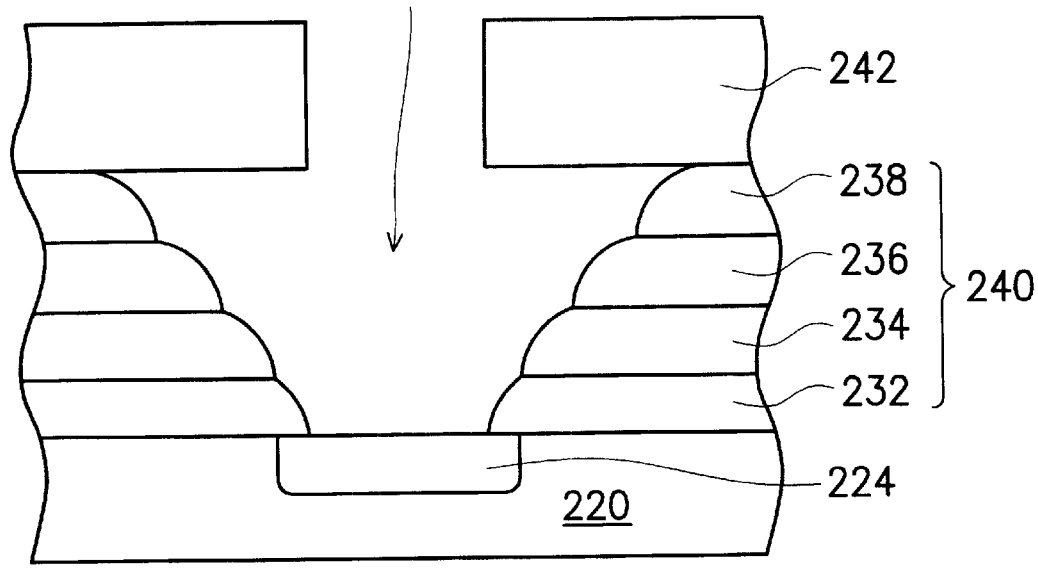

In FIG. 5C, an isotropic etching step is performed on the dielectric layer 240 exposed within the opening 246, while the etching mask 242 remains on the topmost dielectric layer 238. Being further etched, the opening 246 is enlarged and denoted as 247 as shown in FIG. 5C. The isotropic etching step includes chemical dry etch, chemical wet etch and chemical vapor etch. A mixture of hydrogen fluoride and ammonium fluoride, hydrogen fluoride, nitric acid and phosphoric acid can be used for performing the chemical wet etching. Since the anisotropic and isotropic etching steps are performed using the same mask 242, therefore, the total number of photomask is reduced.

Figure 5D:
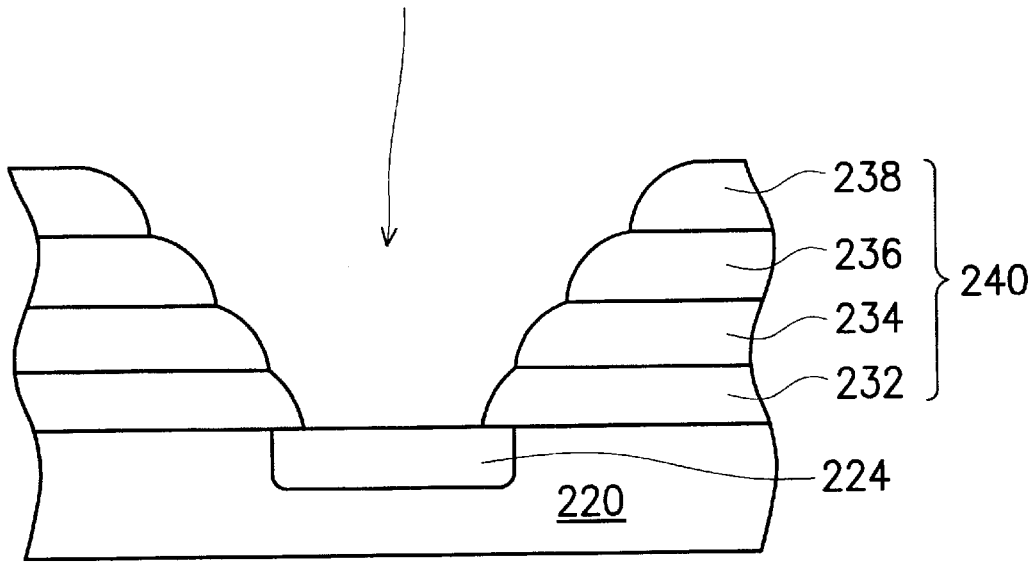

As the etching rate for the dielectric layers 232, 234, 236 and 238 is different from each other. Consequently, after the isotropic etching step, the etched portion of each of the dielectric layers 232, 234, 236 and 238 is uneven. In this embodiment, the etching rate gradually decreases from the topmost dielectric layer 238 to the bottommost dielectric layer 232. In FIG. 5D, the etching mask 242 is removed. As shown in the figure, the opening 248 has a stair-like profile with two slanting sidewalls. Each slanting sidewall can further be divided into four small slopes.

Figure 5E:
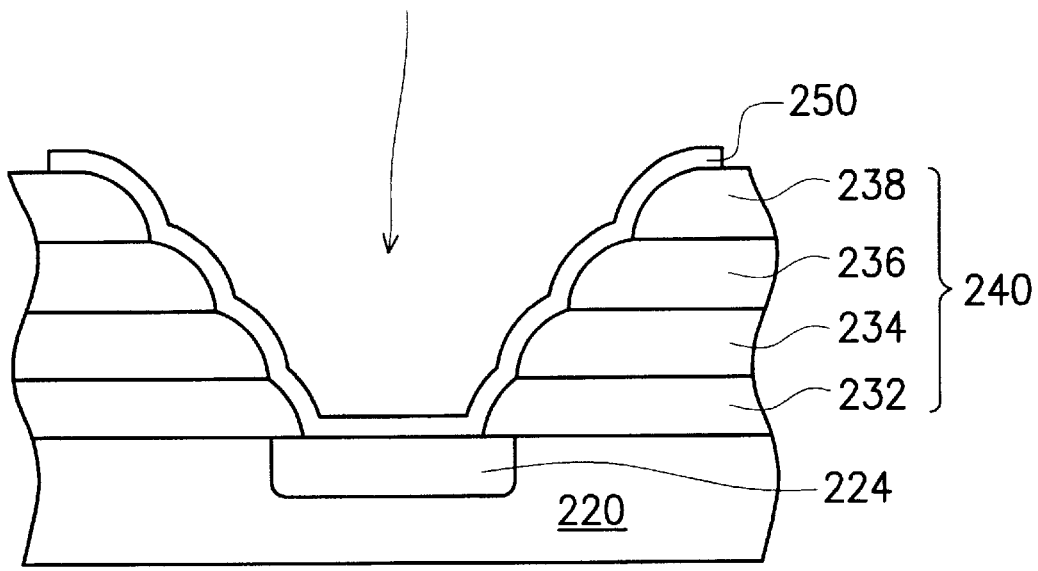
Figure 5F:
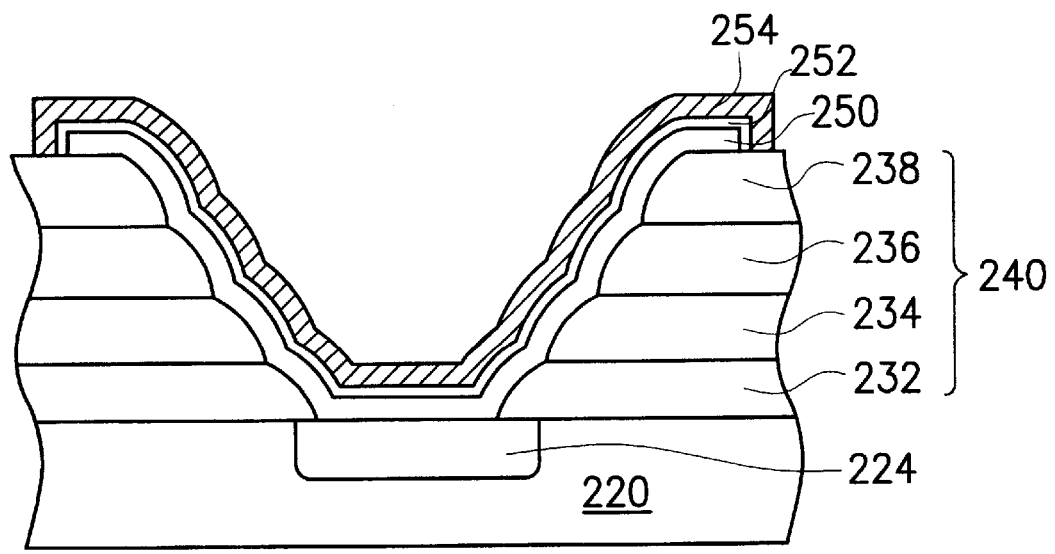

In FIG. 5E, a conductive layer 250 is formed along the surface profile of the opening 248. That is, the conformal conductive layer 250 is formed on the dielectric layer 240 and the device region 224 exposed within the opening 248. In FIG. 5F, a dielectric layer 252 conformal to the conductive layer 250 is formed on the conductive layer 250. A conductive layer 254 is further formed on the dielectric layer 252. The material for forming the dielectric layer 252 includes silicon nitride, silicon oxide, oxide/nitride/oxide (ONO), a lead zirconium titanate, bismuth strontium titanate and tantalum oxide. The conductive layers 250 and 254 include polysilicon and tungsten silicide. As the conductive layer 250 is conformal to the surface profile of the opening 248 (the dielectric layer 240), and the dielectric layer 252 is conformal to the conductive layer 250, the dielectric layer 252 is thus formed with a stair-like surface profile. Consequently, the effective surface of the dielectric layer 252 is enlarged and the capacitance is greatly increased.

The invention provides at least the following advantages:

(1) As the anisotropic and isotropic etching steps for forming the opening within the dielectric layer use the same etching mask, the total number of the photomasks used in this method is reduced.

(2) The opening is formed with a stair-like profile that has a greatly enlarged surface area to enable the dielectric layer formed subsequently to have an increased effective surface for the capacitor.

(3) While forming a gate in the opening, the dielectric layer between the floating gate and the control gate has an increases surface without resulting the vertical etching thickness.

(4) As the effective surface of the dielectric layer between the control gate and the floating gate, or between the top and bottom electrode of a capacitor, is increased, the performance of the device is greatly enhanced.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method of fabricating a gate over a substrate which comprising a device structure, the device structure including a source/drain region, a gate dielectric layer, a first gate conductive layer, and a first dielectric layer encompassing the first gate conductive layer, the method comprising:

forming a plurality of second dielectric layers on the first dielectric layer and the first gate conductive layer;

forming a first etching mask on a topmost second dielectric layer, the etching mask comprising a first opening expose a portion of the topmost second dielectric layer;

performing an anisotropic etching step to form a second opening that exposes the first gate conductive layer performing an isotropic etching step on the second dielectric layers exposed within the second opening with the etching mask remaining on the topmost second dielectric layer, so that a third opening having an uneven surface since the second dielectric layers have different etching rates from each other is formed;

removing the first etching mask.

2. The method according to claim 1, wherein the step of performing the isotropic etching step comprising forming the third opening with a stair-like profile.

3. The method according to claim 1, wherein the step of forming the second dielectric layers comprises forming the second dielectric layers with materials including at least one of the oxide, silicon nitride, doped oxide, doped silicon nitride, borosilicate glass (BSG), borophosphosilicate glass (BPSG), phosphosilicate glass (PSG), boro-oxide, phospho-oxide, borophospho-oxide, spin-on-glass or organic silicide containing silicon and oxide.

4. The method according to claim 1, wherein the step of forming the second dielectric layers includes a forming each of the second dielectric layers with a certain density to result in different isotropic etching rates from each other.

5. The method according to claim 1, wherein the step of performing the isotropic etching includes a step of controlling the dopant concentration of the second dielectric layers to result in different etching rates.

6. The method according to claim 1, wherein the step of performing the isotropic etching includes a chemical dry etching process, a chemical wet etching process, or a chemical vapor etching process.

7. The method according to claim 6, wherein the step of chemical wet etching process comprises a step of using one of a mixture of hydrogen fluoride and ammonium fluoride, nitric acid or phosphoric acid as an etchant.

8. The method according to claim 1, further comprising the following steps:
   forming a conformal conductive layer covering a bottom surface and a sidewall of the third opening, including the second dielectric layers and the first gate conductor layer exposed by the third opening;
   patterning the first conductive layer to expose the second dielectric layers out of the third opening;
   forming a conformal third dielectric layer on the first conductive layer as a gate dielectric layer; and
   forming a second conductive layer on the third dielectric layer.

9. The method according to claim 8, wherein the step of forming the third dielectric layer comprises forming a silicon nitride layer, a silicon oxide layer, a composite layer of oxide/nitride/oxide, a lead zirconium titanate layer or a tantalum oxide layer.

10. The method according to claim 8, wherein the step of forming the second conductive layer comprises a step of forming one of a polysilicon layer and a tungsten layer.

* * * * *